United States Patent
Yase et al.

(10) Patent No.: US 10,331,991 B1
(45) Date of Patent: Jun. 25, 2019

(54) RF TAG CIRCUIT

(71) Applicant: OMRON Corporation, Kyoto (JP)

(72) Inventors: Satoshi Yase, Nara (JP); Tetsuya Nosaka, Ibaraki (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/103,946

(22) Filed: Aug. 15, 2018

(30) Foreign Application Priority Data

Sep. 14, 2017 (JP) ................................ 2017-177014

(51) Int. Cl.
| | |
|---|---|
| G06K 19/06 | (2006.01) |
| G06K 19/07 | (2006.01) |
| H03H 7/38 | (2006.01) |
| H02J 50/20 | (2016.01) |
| H02M 7/06 | (2006.01) |

(52) U.S. Cl.
CPC ..... G06K 19/0709 (2013.01); G06K 19/0702 (2013.01); H02J 50/20 (2016.02); H03H 7/38 (2013.01); H02M 7/06 (2013.01)

(58) Field of Classification Search
CPC .................................. G06K 19/0723
USPC ............................ 235/492; 340/572.1–572.9
See application file for complete search history.

(56) References Cited

U.S. PATENT DOCUMENTS

| | | | |
|---|---|---|---|
| 2007/0096881 A1 | 5/2007 | Pillai | |
| 2009/0027169 A1* | 1/2009 | Kondo | ................. G06K 7/0008 340/10.2 |
| 2010/0045446 A1 | 2/2010 | Hyun et al. | |
| 2015/0248604 A1 | 9/2015 | Diorio et al. | |
| 2015/0324681 A1 | 11/2015 | Mats et al. | |
| 2017/0193256 A1 | 7/2017 | Jung et al. | |

FOREIGN PATENT DOCUMENTS

| | | |
|---|---|---|
| CN | 106384144 | 2/2017 |
| JP | H07111470 | 4/1995 |
| JP | 2000251032 | 9/2000 |
| TW | I563808 | 12/2016 |

OTHER PUBLICATIONS

"Search Report of Europe Counterpart Application", dated Dec. 17, 2018, p. 1-p. 6.
Office Action of Taiwan Counterpart Application, with English translation thereof, dated Jan. 8, 2019, pp. 1-8.

\* cited by examiner

*Primary Examiner* — Jamara A Franklin
(74) *Attorney, Agent, or Firm* — JCIPRNET

(57) ABSTRACT

An RF tag circuit including a power storage unit is provided, in which an increase in time required for a voltage change occurring when an impedance is adjusted is reduced. The RF tag circuit is connected to an antenna and a load. The RF tag circuit includes a rectification circuit, a matching circuit, a power storage unit, and a control unit. The rectification circuit rectifies a radio wave received by the antenna and supplies DC power. The matching circuit, of which an impedance is changeable, is interposed between the antenna and the rectification circuit. The power storage unit stores DC power input from the rectification circuit and supplies the stored DC power to the load. The control unit disconnects the power storage unit from the RF tag circuit and adjusts the impedance of the matching circuit such that the amount of the power supplied by the rectification circuit increases.

20 Claims, 19 Drawing Sheets

RF TAG CIRCUIT

CROSS-REFERENCE TO RELATED APPLICATION

This application claims the priority benefit of Japan application serial no. 2017-177014, filed on Sep. 14, 2017. The entirety of the above-mentioned patent application is hereby incorporated by reference herein and made a part of this specification.

BACKGROUND

Technical Field

The disclosure relates to an RF tag circuit that is connected to an antenna and a load.

Description of Related Art

In recent years, the development of RF tags has been remarkable, and use of RF tags for driving loads such as a sensor, an LED, an IC, a microcomputer, a communication circuit, and an RF tag circuit as examples using power supplied through received radio waves as an energy source has increased in addition to their original use of object identification. In some cases, the electric power received by RF tags is further increased such that the electric power is stably supplied for operations of such loads. In such an RF tag circuit, there are cases in which a power supply capability for a load decreases due to impedance mismatch between an antenna and the RF tag circuit. The impedance mismatch may occur due to a change in the impedance of the antenna, for example, according to the attachment or approach of a metal piece, or dielectrics such as water or oil to the antenna. For this reason, technologies for impedance matching between an antenna and an RF tag circuit have been proposed. In impedance adjustment, a search for an impedance value for which a voltage becomes a maximum is performed while the impedance of the RF tag circuit is changed (for example, see Japanese Patent Laid-Open No. 7-111470).

In order to stably drive a load even when the supplied electric power decreases due to deterioration of the reception status of radio waves or the like, an RF tag circuit including a power storage unit such as a capacitor that stores electric power supplied by radio waves is used. By using the electric power supplied from the power storage unit, even when the electric power supplied through radio waves decreases, a stable operation of the load can be performed.

For a stable operation of the load, it is desirable that the capacitance of the power storage unit is large. However, when the capacitance of the power storage unit increases, the time constant of the power storage unit increases. When the time constant is large, a change in the voltage after a change of the impedance is gentler than when the time constant is small. For this reason, a time required for detecting a change in the voltage after a change of the impedance may increase. In addition, a voltage change occurring within a predetermined period during which the RF tag circuit detects a voltage change may not reach a voltage range that can be detected by the RF tag circuit, and the RF tag circuit may erroneously detect that adjustment of the impedance has been completed.

SUMMARY

An embodiment of the disclosure provides an RF tag circuit connected to an antenna and a load as an example. The RF tag circuit includes a rectification circuit, a matching circuit, a power storage unit, and a control unit. The rectification circuit rectifies a radio wave received by the antenna and supplies DC power. The matching circuit, of which an impedance is changeable, is disposed between the antenna and the rectification circuit. The power storage unit stores DC power input from the rectification circuit and supplies the stored DC power to the load. The control unit disconnects the power storage unit from the RF tag circuit and adjusts the impedance of the matching circuit such that the DC power supplied by the rectification circuit increases.

DESCRIPTION OF THE EMBODIMENTS

Figure 1:
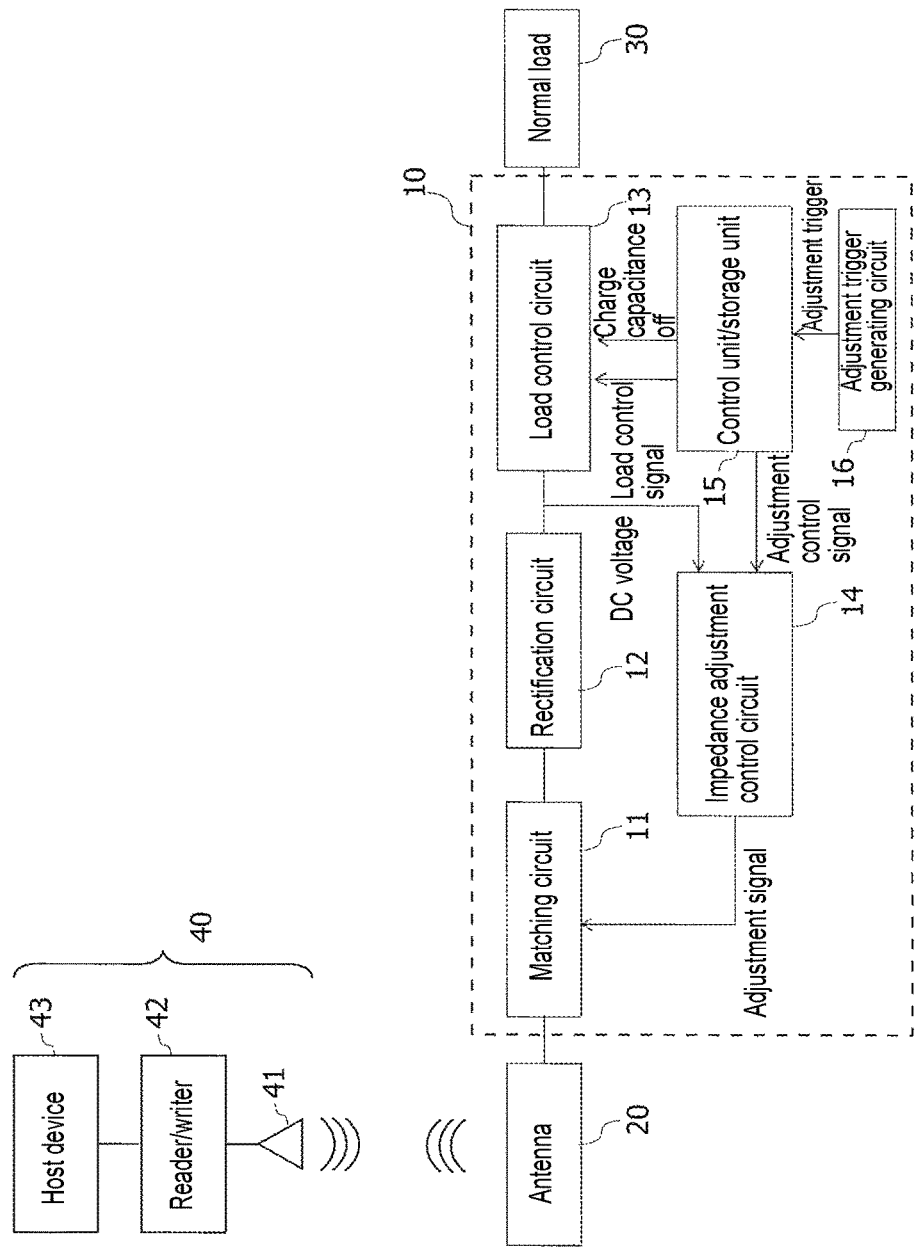
FIG. 1 is a diagram illustrating one example of a configuration and a use form of an RF tag circuit according to an embodiment.

An embodiment of the disclosure is provided to reduce an increase in a time required for a voltage change occurring when impedance is adjusted in an RF tag circuit including a power storage unit.

In the configuration described above, the power storage unit is a device capable of storing electric power and is, for example, a capacitor. The load is a device driven using electric power supplied through a received radio wave as an energy source. The load is, for example, a sensor, an LED, an IC, a microcomputer, a communication circuit, an RF tag circuit, or the like. The matching circuit includes a variable impedance device. The variable impedance device may be, for example, a circuit acquired by combining a plurality of capacitors or an analog control device such as a varactor diode. In the configuration described above, the load can be driven using electric power supplied from the power storage unit. For this reason, even when the status of reception of radio waves using the antenna deteriorates, the RF tag circuit can stably drive the load. When the impedance is adjusted using the control unit, the power storage unit is disconnected from the RF tag circuit, and accordingly, an increase in time required for a voltage change at the time of adjusting the impedance due to the influence of the time constant of the power storage unit is reduced.

In the configuration described above, when the impedance of the matching circuit is adjusted, the control unit may further execute a process of disconnecting the load from the RF tag circuit and connecting a substitute load having a resistance value different from the load to the RF tag circuit. Here, the substitute load may have a power consumption lower than the load or have a resistance value larger than the load. In addition, in the configuration described above, the load may be driven at a predetermined cycle, and the substitute load may have a resistance value determined based on a duty ratio representing a ratio between a driving period of the load in the predetermined cycle and the resistance value of the load. By connecting such a substitute load, the magnitude of a drop in a voltage in a period in which impedance adjustment is performed by an adjustment unit decreases.

In the configuration described above, the substitute load may be a variable resistor of which a resistance value is changeable. In such a case, the control unit may calculate a resistance value based on current consumption of the load, the duty ratio of the load, and a voltage applied to the load and set the calculated resistance value as a resistance value of the substitute load. In addition, the resistance value of the substitute load may be appropriately set by a user using the RF tag circuit. By employing such a configuration, even when there are variations in the current consumption of the load, the duty ratio of the load, and the voltage applied to the load, an appropriate resistance value can be set in the substitute load.

In the configuration described above, a measurement unit that measures a current supplied to the load may be further included, and the current consumption of the load may be measured by the measurement unit. By employing such a configuration, even when there are variations in the current consumption of the load, an appropriate resistance value can be set in the substitute load.

In the configuration described above, the control unit may calculate the duty ratio of the load by aggregating a period during which the load is driven and a period during which the load is not driven. By employing such a configuration, even when there are variations from a predetermined duty ratio, an appropriate resistance value can be set in the substitute load.

In the configuration described above, the control unit may further execute a process of connecting the power storage unit and the load when executing the process of connecting the substitute load to the RF tag circuit. By employing such a configuration, also when the impedance is adjusted, electric power is supplied from the power storage unit to the load. For this reason, even when the impedance is adjusted, the load can be continuously operated.

An RF tag circuit of the disclosure is capable of reducing an increase in a time required for a voltage change occurring when impedance is adjusted in an RF tag circuit including a power storage unit.

Hereinafter, embodiments will be described with reference to the drawings. The configurations of the embodiments illustrated below are examples, and the disclosed technologies are not limited to the configurations of the embodiments.

First Embodiment

FIG. 1 is a diagram illustrating one example of a configuration and a use form of an RF tag circuit 10 according to an embodiment. The RF tag circuit 10 is connected to an antenna 20 and a normal load 30. The RF tag circuit 10 is a circuit that constitutes a system in which a reader/writer device 40 can wirelessly use the normal load 30. The normal load 30 is a device that is driven using electric power supplied through received radio waves as an energy source. The normal load 30 is, for example, a sensor, an LED, an IC, a microcomputer, a communication circuit, an RF tag circuit, or the like. The RF tag circuit 10 is a circuit that drives the normal load 30 using radio waves received from the reader/writer device 40 as an energy source. The RF tag circuit 10 may be regarded also as a wireless power supply circuit or a wireless power supply device. In addition, the normal load 30 connected to the RF tag circuit 10 may be regarded as a wireless sensor. The RF tag circuit 10 is, for example, realized by any one of an IC chip, a circuit combining discrete components, and a circuit combining an IC chip and discrete components. In addition, the reader/writer device 40 is, for example, a device in which a reader/writer 42 to which the antenna 41 is attached is connected to a host device 43 such as a computer. The normal load 30 is one example of a "load".

The RF tag circuit 10 is, for example, a circuit that is connected to the antenna 20 receiving radio waves from the reader/writer device 40 and the normal load 30 used by the reader/writer device 40. The RF tag circuit 10 includes a matching circuit 11, a rectification circuit 12, a load control circuit 13, an impedance adjustment control circuit 14, a control unit/storage unit 15, and an adjustment trigger generating circuit 16.

Figure 2:
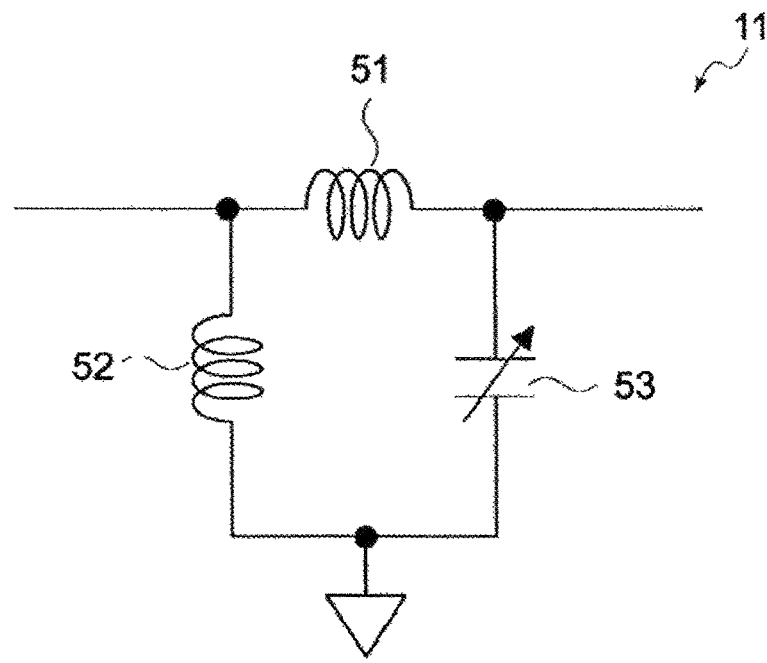
FIG. 2 is a diagram illustrating one example of the configuration of a matching circuit.
Figure 3:
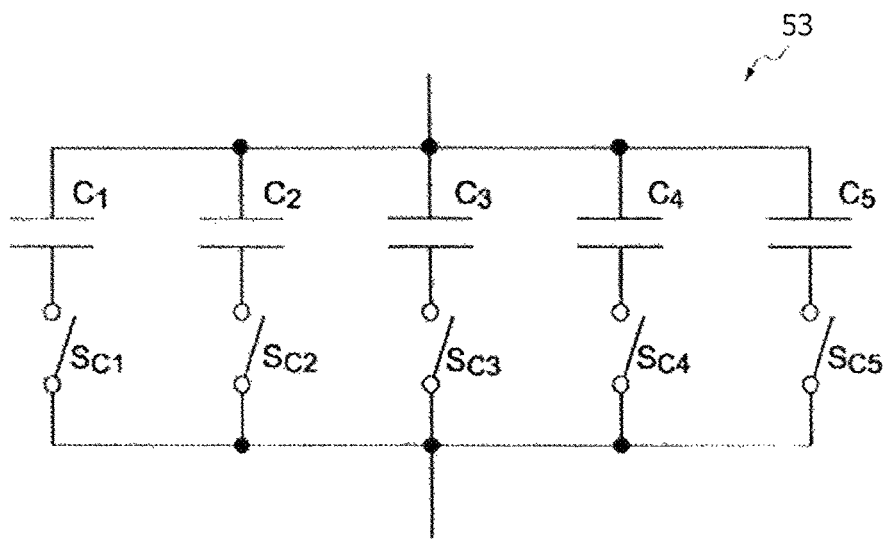
FIG. 3 is a diagram illustrating one example of the configuration of a variable resistor of a matching circuit.

The matching circuit 11 is a circuit that is used for impedance matching between the antenna 20 and a circuit disposed inside the RF tag circuit 10. A specific circuit configuration of the matching circuit 11 is not particularly limited. The circuit configuration of the matching circuit 11, for example, as exemplified in FIG. 2, may be a circuit acquired by combining two inductors 51 and 52 and a variable-capacitance capacitor 53 of which a capacitance can be changed in accordance with an adjustment signal supplied from the impedance adjustment control circuit 14. As the variable-capacitance capacitor 53 of which a capacitance can be changed in accordance with an adjustment signal received from the impedance adjustment control circuit 14, for example, a circuit acquired by combining capacitors $C_1$ to $C_5$ having mutually different capacitance values and switches $S_{C1}$ to $S_{C5}$ as illustrated in FIG. 3 may be used. In addition, the matching circuit 11 may be an analog control device such as a varactor diode. In the RF tag circuit 10, when a metal piece, or a dielectric such as water or oil is attached to or approaches the antenna 20, the impedance of the antenna 20 may change. When impedance mismatch between the antenna 20 and the circuit disposed inside the RF tag circuit 10 increases in accordance with a change in the impedance of the circuit of the antenna 20, energy transmission efficiency from the antenna 20 to the circuit disposed inside the RF tag circuit 10 decreases. Thus, by achieving impedance matching between the antenna 20 and the circuit disposed inside the RF tag circuit 10 using the matching circuit 11, a decrease in the energy transmission efficiency from the antenna 20 to the circuit disposed inside the RF tag circuit 10 is reduced. The matching circuit 11 is one example of "matching circuit".

Figure 4:
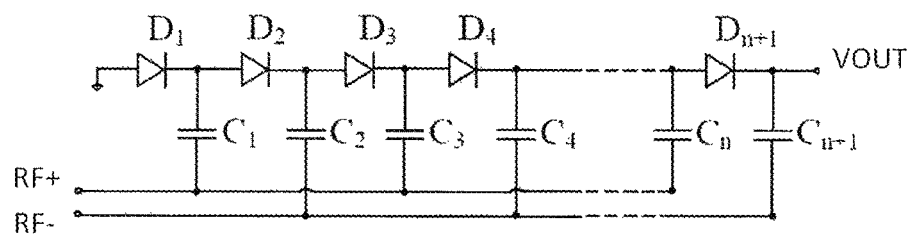
FIG. 4 is a diagram illustrating one example of the configuration of a rectification circuit.

The rectification circuit 12 is a circuit that rectifies AC power output by the antenna 20 that has received radio waves and supplies DC power to the normal load 30 and each unit (the load control circuit 13 and the impedance adjustment control circuit 14) disposed inside the RF tag circuit 10. FIG. 4 is a diagram illustrating one example of the configuration of the rectification circuit 12. The rectification circuit 12, as exemplified in FIG. 4, may be a circuit acquired by connecting voltage doubler rectification circuits each configured of two diodes D ($D_1$ and $D_2$ or the like) and two capacitors ($C_1$ and $C_2$ or the like) in multiple stages. The rectification circuit 12 may generate a DC signal of a separate system used for the impedance adjustment separately from a power supply voltage VOUT used for driving the normal load 30. The rectification circuit 12 is one example of a "rectification circuit".

Figure 5:
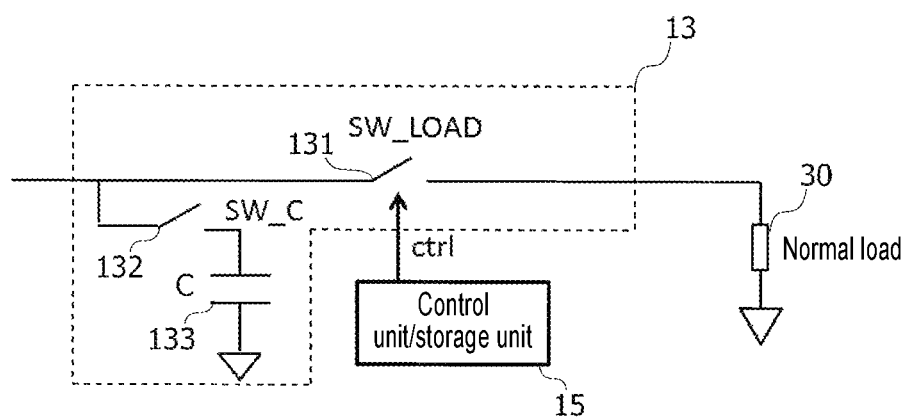
FIG. 5 is a diagram illustrating one example of the configuration of a load control circuit.

The load control circuit 13 is a circuit that activates the normal load 30 in accordance with a signal received from the control unit/storage unit 15. FIG. 5 is a diagram illustrating one example of the configuration of the load control circuit 13. As the load control circuit 13, as exemplified in FIG. 5, a circuit including a switch (SW_LOAD) 131 switching on and off of the power supply to the normal load 30, a capacitor 133, and a switch (SW_C) 132 switching on and off of the power supply to the capacitor 133 may be used. The SW_C 132 is normally in the on state, and the capacitor 133, for example, stores DC power supplied from the rectification circuit 12. The capacitor 133, for example, may store excess power not used for driving the normal load 30 from the DC power supplied from the rectification circuit 12. The excess power is, for example, power supplied through a radio wave received by the antenna in a period other than a period for driving the normal load 30. The power stored in the capacitor 133 is supplied to the normal load 30. By selecting the capacitor 133 of which a capacitance is relatively large (for example, a capacitance larger than a reciprocal of a resistance component of the normal load 30 (having a large time constant (in order of seconds))), a drop in the voltage supplied to the normal load 30 can be reduced. By selecting such a capacitor 133, even when instantaneous power cutoff or the like occurs due to deterioration of the status of reception from the reader/writer device 40 or the like, the normal load 30 can be operated more stably. The SW_C 132 is turned off when the load control circuit 13 receives a charge capacitance off signal from the control unit/storage unit 15. When the SW_C 132 is turned off, DC power supplied from the rectification circuit 12 is supplied to the capacitor 133, and the capacitor 133 is charged. The SW_LOAD 131 is turned on when the load control circuit 13 receives a load control signal ctrl from the control unit/storage unit 15. When the SW_LOAD 131 is turned on, the DC power supplied from the rectification circuit 12 is supplied to the normal load 30, and the normal load 30 is activated. As will be described later, the load control signal ctrl is transmitted at a predetermined cycle, and accordingly, the normal load 30 is activated at the predetermined cycle. The capacitor 133 is one example of a "power storage unit".

The control unit/storage unit 15 transmits a signal for switching on and off of the SW_LOAD 131 and SW_C 132 of the load control circuit 13. In addition, the control unit/storage unit 15 instructs the impedance adjustment control circuit 14 to start impedance adjustment. The control unit/storage unit 15, for example, transmits a load control signal ctrl to the load control circuit 13 in response to a command (a clock signal or the like) input from the outside at a predetermined cycle, thereby performing switching on and off of the SW_LOAD 131 of the load control circuit 13. As a result, the normal load 30 is activated at the predetermined cycle. When receiving an adjustment trigger from the adjustment trigger generating circuit 16, the control unit/storage unit 15 transmits an adjustment control signal instructing impedance adjustment to the impedance adjustment control circuit 14 and transmits a charge capacitance off signal instructing to turn off the SW_C 132 to the load control circuit 13.

The control unit/storage unit 15 is, for example, a device acquired by combining a processor and a storage unit. The processor is not limited to a single processor and may have a multi-processor configuration. In addition, a single processor connected to a single socket may have a multi-core configuration. At least a part of the process executed by the processor, for example, may be performed by a dedicated processor such as a digital signal processor (DSP), a graphics processing unit (GPU), a numeric data processor, a vector processor, or an image processing processor. In addition, at least a part of the processor executed by the processor may be executed by an integrated circuit (IC) or any other digital circuit. An analog circuit may be included in at least a part of the processor. The integrated circuit includes a large scale integrated circuit (LSI), an application specific integrated circuit (ASIC), and a programmable logic device (PLD). The PLD, for example, includes a field-programmable gate array (FPGA). The processor may be a combination of a processor and an integrated circuit. This combination is, for example, called as a micro controller unit (MCU), a system-on-chip (SoC), a system LSI, a chip set, or the like. The storage unit is a storage medium for which data can be read and written by the processor. The storage unit is, for example, a storage medium that is directly accessed from the processor. The storage unit, for example, includes a random access memory (RAM) and a read only memory (ROM). The control unit/storage unit 15 is one example of a "control unit".

The adjustment trigger generating circuit 16 transmits an adjustment trigger instructing to start impedance adjustment to the control unit/storage unit 15. For example, when a DC voltage input from the rectification circuit 12 to the impedance adjustment control circuit 14 is lower than a predetermined threshold, the adjustment trigger generating circuit 16 transmits an adjustment trigger. For example, when a trigger is input from an external circuit, the adjustment trigger generating circuit 16 may transmit an adjustment trigger.

Figure 6:
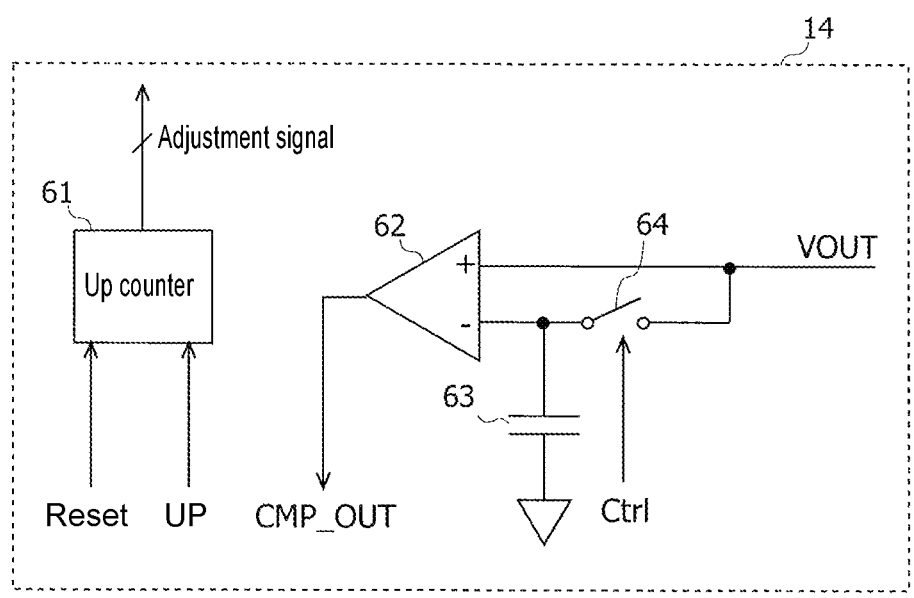
FIG. 6 is a diagram illustrating one example of the configuration of an impedance adjustment control circuit.

The impedance adjustment control circuit 14 is a circuit that outputs an adjustment signal (in this embodiment, an adjustment signal for designating the capacitance of the variable-capacitance capacitor 53 (FIG. 2)) for designating the impedance of the matching circuit 11. In the RF tag circuit 10 according to this embodiment, for example, the impedance adjustment control circuit 14 having the configuration illustrated in FIG. 6 is used.

While the overall operation of the impedance adjustment control circuit 14 will be described later, an up counter 61 is a counter that clears the counter value to "0" when a reset pulse is input and counts up when an up pulse is input. The counter value of the up counter 61 is used as an adjustment signal designating the impedance of the matching circuit 11 (the capacitance of the variable-capacitance capacitor 53 (FIG. 2)).

A comparator 62 is a circuit that outputs a result of comparison between the power supply voltage (the output voltage of the rectification circuit 12) VOUT and the voltage of a capacitor 63. The output of the comparator 62 is input to the control unit/storage unit 15 through a CMP_OUT signal line. A switch 64 is a switch that is controlled such that it is turned on/off by the control unit/storage unit 15 through a Ctrl signal line.

Figure 7:
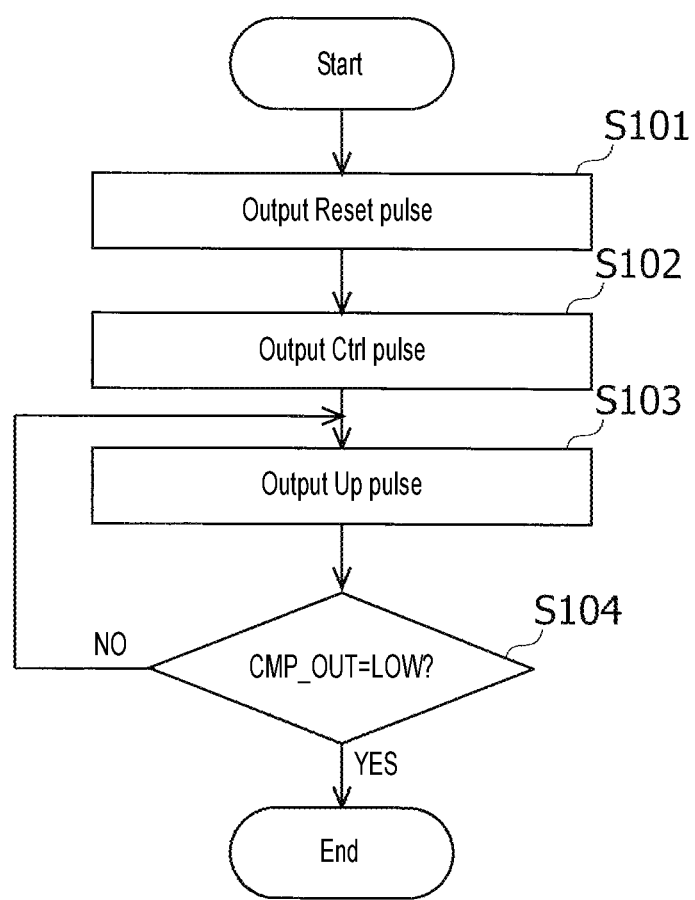
FIG. 7 is a diagram illustrating one example of a control flow of a control unit/storage unit controlling an impedance adjustment control circuit.

FIG. 7 is a diagram illustrating one example of a control flow of the control unit/storage unit 15 controlling the impedance adjustment control circuit. The control flow illustrated in FIG. 7 is, for example, started in accordance with an input of an adjustment trigger from the adjustment trigger generating circuit 16 to the control unit/storage unit 15. Hereinafter, one example of the control flow of the control unit/storage unit 15 controlling the impedance adjustment control circuit 14 will be described with reference to FIG. 7.

The control unit/storage unit 15 to which an adjustment trigger has been input, first, outputs a Reset pulse (Step S101). Accordingly, the count value of the up counter 61 disposed inside the impedance adjustment control circuit 14 (see FIG. 6) is reset to "0", and the capacitance of the variable-capacitance capacitor 53 (FIG. 2) disposed inside the matching circuit 11 is adjusted to a lowest capacitance $C_0$.

Next, the control unit/storage unit 15 outputs a Ctrl pulse (Step S102). That is, the control unit/storage unit 15 causes the voltage of the capacitor 63 (an input voltage input to a "−" terminal of the comparator 62) to coincide with the power supply voltage VOUT at that time point by turning on the switch 64 and then holds the voltage of the capacitor 63 by turning off the switch 64.

Thereafter, the control unit/storage unit 15 outputs an UP pulse (Step S103) and then determines whether or not the output CMP_OUT of the comparator 62 is low (Step S104).

When an UP pulse is input, the count value of the up counter 61 is counted up, and accordingly, the capacitance of the variable-capacitance capacitor 53 disposed inside the matching circuit 11 increases. When the impedance of the matching circuit 11 after increasing the capacitance of the variable-capacitance capacitor 53 does not become an appropriate value, and the impedance of the matching circuit 11 is close to an appropriate value, the power supply voltage increases. On the other hand, when the impedance of the matching circuit 11 after increasing the capacitance of the variable-capacitance capacitor 53 becomes an appropriate value, the voltage supply voltage hardly changes. In addition, when the impedance of the matching circuit 11 after increasing the capacitance of the variable-capacitance capacitor 53 does not become an appropriate value, and the impedance further deviates from an appropriate value, the power supply voltage hardly changes. Accordingly, when the impedance has an appropriate value or when the impedance further deviates from the appropriate value, the output CMP_OUT becomes low. For this reason, when the output CMP_OUT is low, since the impedance has an appropriate value, or in order to suppress the impedance from further deviating from the appropriate value, the impedance adjustment of the matching circuit 11 is completed. On the other hand, when the impedance of the matching circuit 11 does not have an appropriate value, and the impedance of the matching circuit 11 is close to an appropriate value, the output CMP_OUT becomes high. For this reason, when the output CMP_OUT is high, the impedance adjustment of the matching circuit 11 is not completed, and the impedance adjustment continues to be executed.

For this reason, when the output CMP_OUT of the comparator 62 is high (Step S104: No), the control unit/storage unit 15 restarts the process of Step S103 and subsequent steps. Then, when the output CMP_OUT of the comparator 62 becomes low (Step S104: Yes), the control unit/storage unit 15 ends this impedance adjusting process (the process illustrated in FIG. 7).

Figure 8:
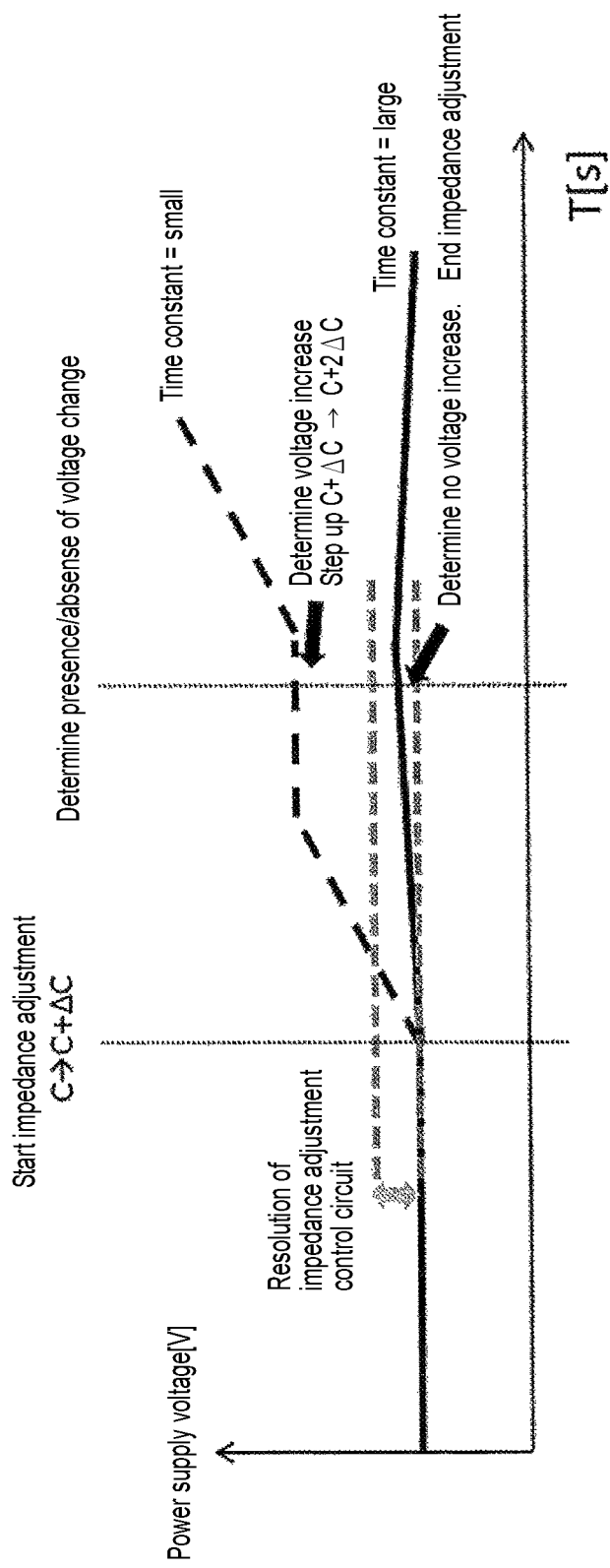
FIG. 8 is a diagram illustrating one example of variations in a power supply voltage input from a rectification circuit to an impedance adjustment control circuit when an impedance of a matching circuit is close to an appropriate value.

FIG. 8 is a diagram illustrating one example of variations in a power supply voltage input from the rectification circuit 12 to the impedance adjustment control circuit 14 when an impedance of the matching circuit 11 is close to an appropriate value. In FIG. 8, variations in the power supply voltages input from the rectification circuit 12 to the impedance adjustment control circuit 14 in a case in which the time constant of the RF tag circuit 10 is large and a case in which the time constant is small are compared with each other. As exemplified in FIG. 8, when the time constant is small, when the impedance value of the matching circuit 11 increases, the power supply voltage increases within a period in which the control unit/storage unit 15 detects an increase in the power supply voltage, and accordingly, the control unit/storage unit 15 can detect the increase in the power supply voltage. For this reason, the control unit/storage unit 15 can determine that impedances are in a mismatch state between the antenna 20 and the RF tag circuit 10. A change in the power supply voltage becomes gentler as the time constant further increases. Thus, when the time constant becomes large to some degree, it is difficult to detect an increase in the power supply voltage accompanying an increase in the impedance value within the period in which the control unit/storage unit 15 detects an increase in the power supply voltage. For this reason, even when there actually is impedance mismatch between the antenna 20 and the circuit disposed inside the RF tag circuit 10, the control unit/storage unit 15 does not detect an increase in the power supply voltage, and accordingly, it may be erroneously detected that there is impedance matching therebetween. Thus, in the RF tag circuit 10 according to the embodiment, when the impedance is adjusted, a process of causing the time constant of the RF tag circuit 10 to approach "0" by disconnecting the capacitor 133 from the circuit by turning off the SW_C 132 is executed.

Figure 9:
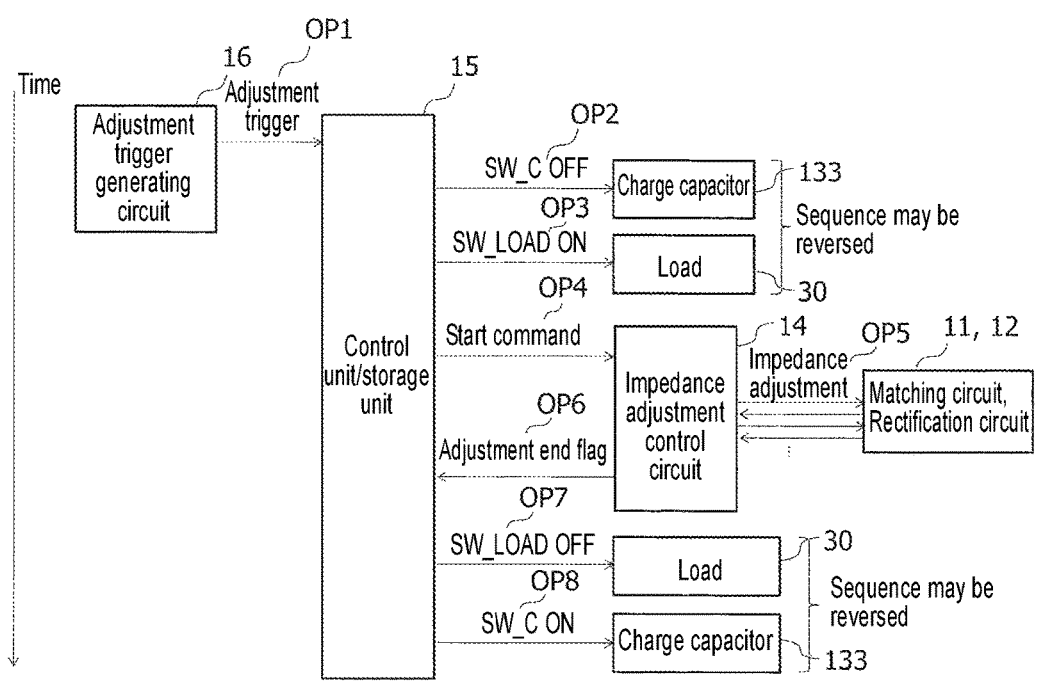
FIG. 9 is a diagram illustrating one example of a processing flow according to an embodiment.

FIG. 9 is a diagram illustrating one example of a processing flow according to the embodiment. In FIG. 9, the time flows from the upper side to the lower side of the drawing. Hereinafter, one example of the processing flow according to the embodiment will be described with reference to FIG. 9.

In OP1, the adjustment trigger generating circuit 16 transmits an adjustment trigger to the control unit/storage unit 15. The adjustment trigger is, for example, transmitted by being triggered by a decrease in the power supply voltage input from the rectification circuit 12 to the impedance adjustment control circuit 14 or the like. The control unit/storage unit 15 that has received an adjustment trigger starts processes of OP2 and subsequent steps. In OP2, the control unit/storage unit 15 transmits a charge capacitance off signal to the load control circuit 13. The load control circuit 13 that has received the charge capacitance off signal turns off the SW_C 132. According to the process of OP2, the capacitor 133 is disconnected from the RF tag circuit 10. In OP3, the control unit/storage unit 15 transmits a load control signal to the load control circuit 13, thereby turning on the SW_LOAD 131 and causing the normal load 30 to be in an operating state. Thereafter, the SW_LOAD 131 maintains to be in the on state until it is turned off in OP7 regardless of the predetermined cycle at which the normal load 30 is operated. Hereinafter, in description presented here, causing the SW_LOAD 131 to be on regardless of the predetermined cycle will be referred to as enforced-on of the SW_LOAD 131. The processes of OP2 and OP3 may be interchanged in the sequence.

In OP4, the control unit/storage unit 15 transmits an adjustment control signal as a start command instructing start of impedance adjustment. In OP5, the impedance adjustment control circuit 14 transmits an adjustment signal to the matching circuit 11 and performs impedance adjustment. Details of the impedance adjustment will be described later. In OP6, the control unit/storage unit 15 determines that the impedance adjustment has been completed based on information representing variations in the power supply voltage that is acquired from the impedance adjustment control circuit 14. In OP7, the control unit/storage unit 15 releases the enforced-on of the SW_LOAD 131. In other words, as a result of the process of OP7, the normal load 30 starts to operate using the predetermined cycle. In OP8, the control unit/storage unit 15 transmits an instruction for turning on the SW_C 132 to the load control circuit 13. In accordance with the process of OP8, the capacitor 133 is connected to the RF tag circuit 10.

Figure 10:
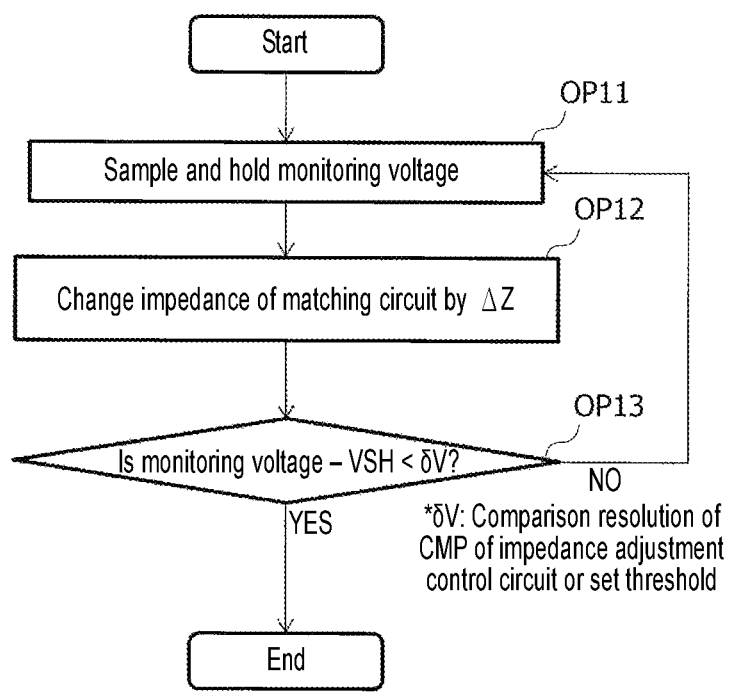
FIG. 10 is a diagram illustrating one example of a processing flow of impedance adjustment according to an embodiment.

FIG. 10 is a diagram illustrating one example of the processing flow of impedance adjustment according to the embodiment. The process exemplified in FIG. 10 is, for example, a process executed in OP5 illustrated in FIG. 9. In the process exemplified in FIG. 10, it is assumed that a Reset pulse has already been transmitted to the up counter 61. Hereinafter, one example of the processing flow of the impedance adjustment according to the embodiment will be described with reference to FIG. 10.

In OP11, the control unit/storage unit 15 samples and holds (S/H) the power supply voltage (denoted as a monitoring voltage in the drawing) input from the rectification circuit 12 to the impedance adjustment control circuit 14. The process of OP11, for example, corresponds to the process of S102 illustrated in FIG. 7. In OP12, the impedance adjustment control circuit 14 transmits an adjustment signal for increasing the impedance of the matching circuit 11. The matching circuit 11 that has received the adjustment signal, for example, increases the impedance of the matching circuit 11 by ΔZ by changing the capacitance of the variable-capacitance capacitor 53. The process of OP12, for example, corresponds to the process of S103 illustrated in FIG. 7. In OP13, the control unit/storage unit 15 acquires the power supply voltage after the increase in the impedance in OP12. The control unit/storage unit 15 determines whether or not a difference between the power supply voltage acquired in OP12 and the power supply voltage that is S/H in OP11 is less than δV. Here, δV is a value that is set in accordance with the resolution of the comparator 141 of the impedance adjustment control circuit 14. In addition, W may be a predetermined threshold. When the difference is less than δV (Yes in OP13), the impedance adjusting process ends. On the other hand, when the difference is not less than δV (No in OP13), the process is returned to OP11. The process of OP13 corresponds to S104 illustrated in FIG. 7. As exemplified in FIG. 10, the process of OP11 and OP12 is repeated until an increase width of the power supply voltage becomes less than the resolution of the comparator 141 or less than a predetermined threshold, and the impedance of the matching circuit 11 is adjusted.

Figure 11:
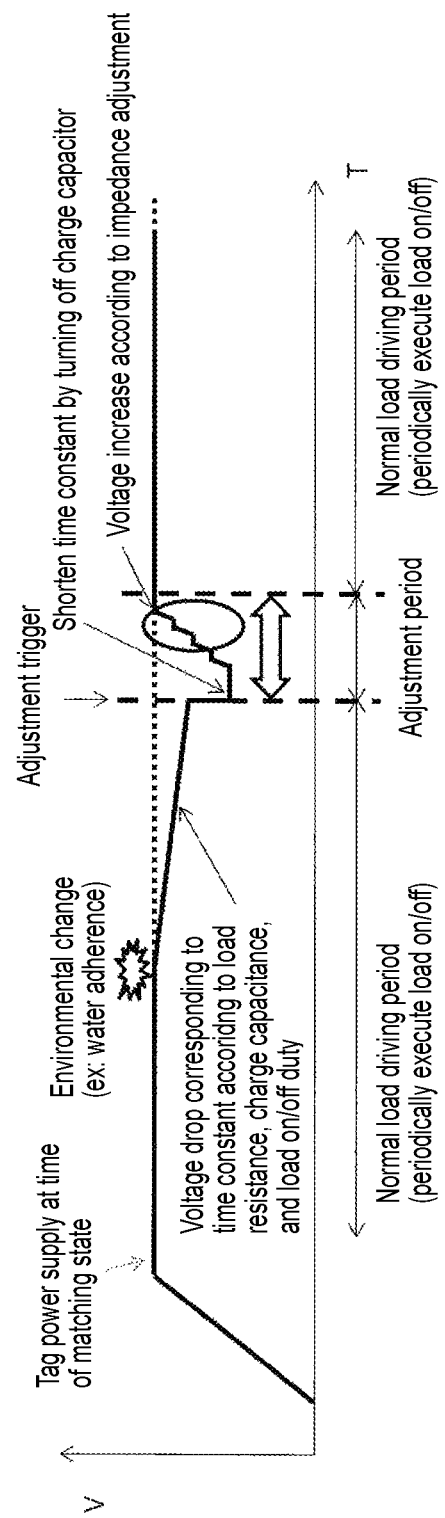
FIG. 11 is a diagram illustrating one example of variations in a power supply voltage input from a rectification circuit to an impedance adjustment control circuit in an embodiment.

FIG. 11 is a diagram illustrating one example of variations in a power supply voltage input from the rectification circuit 12 to the impedance adjustment control circuit 14 in the embodiment. In FIG. 11, the vertical axis represents the voltage, and the horizontal axis represents the time as an example. In addition, in FIG. 11, a normal load driving period in which the normal load 30 is activated at a predetermined cycle and an adjustment period in which an impedance is adjusted are illustrated as an example. When water or the like adheres to the RF tag circuit 10, as exemplified in FIG. 11, the power supply voltage decreases. The power supply voltage gently drops in accordance with the influence of a time constant corresponding to a duty ratio in the operations of the capacitor 133 and the normal load 30. The duty ratio is, for example, information representing a ratio of the driving period of the normal load 30 to a predetermined period. By being triggered by the reception of an adjustment trigger, the RF tag circuit 10 transitions from the normal load driving period to the adjustment period. In the adjustment period, the load control circuit 13 that has received a charge capacitance off signal transmitted from the control unit/storage unit 15 turns off the SW_C 132, thereby disconnecting the capacitor 133 from the RF tag circuit 10. When the capacitor 133 is disconnected from the RF tag circuit 10, the time constant of the RF tag circuit 10 becomes nearly "0". As a result, as in the case in which the time constant is small exemplified in FIG. 8, a change in the power supply voltage after impedance adjustment occurs within a predetermined period in which the control unit/storage unit 15 detects a voltage change. For this reason, the control unit/storage unit 15 can detect an increase in the power supply voltage after the impedance adjustment. The reason the power supply voltage increases in a stepped manner in the adjustment period is that the impedance adjustment control circuit 14 increases the impedance of the matching circuit 11 by ΔZ each time. When it is determined that there is impedance matching between the antenna 20 and the RF tag circuit 10, the RF tag circuit 10 transitions from the adjustment period to the normal load driving period.

According to the embodiment, when the impedance adjustment is performed, the capacitor 133 is disconnected from the RF tag circuit 10. For this reason, the influence of the time constant of the capacitor 133 on variations in the voltage when the impedance is adjusted is reduced. The time constant is, for example, calculated using the following Equation 1.

time constant τ=C×load resistance÷load ON/OFF Duty     (Equation 1)

In Equation 1 represented above, C is capacitance of the capacitor 133, and a load on/off duty is a duty ratio of the normal load 30. In addition, in Equation 1, "/ (slash)" included in the "load ON/OFF duty" does not represent dividing but represents one value as the "load ON/OFF duty". For example, when the capacitance of the capacitor 133 is 100 μF, the load resistance of the normal load 30 is 1 kΩ, and the duty ratio of the normal load 30 is 10%, the time constant τ becomes one second in accordance with Equation 1. For this reason, for example, when the impedance is adjusted by repeating 16 cycle times of the impedance adjusting process exemplified in OP11 to OP13 in FIG. 10, 16 seconds is required for the adjustment of the impedance. Here, as described in the embodiment, when the capacitor 133 is disconnected from the RF tag circuit 10, the electrostatic capacitance of the capacitor 133 may be regarded as "0". For this reason, when the capacitor 133 is disconnected, the time constant τ may be regarded as "0", and thus, a time required for the impedance adjustment is shortened. In addition, by decreasing the influence of the time constant, a change in the power supply voltage after the impedance adjustment occurs within the predetermined period in which the control unit/storage unit 15 detects a voltage change. As a result, although the impedance mismatch is not actually solved, the possibility of erroneous detection of the control unit/storage unit 15 for the completion of the adjustment of the impedance can be decreased. For this reason, according to the embodiment, even when the capacitor 133 having high capacitance is employed for stably operating the normal load 30, the impedance adjustment can be executed more appropriately.

In the embodiment, although the normal load 30 is activated at a predetermined cycle, the normal load may be constantly operated.

First Modified Example

Figure 12:
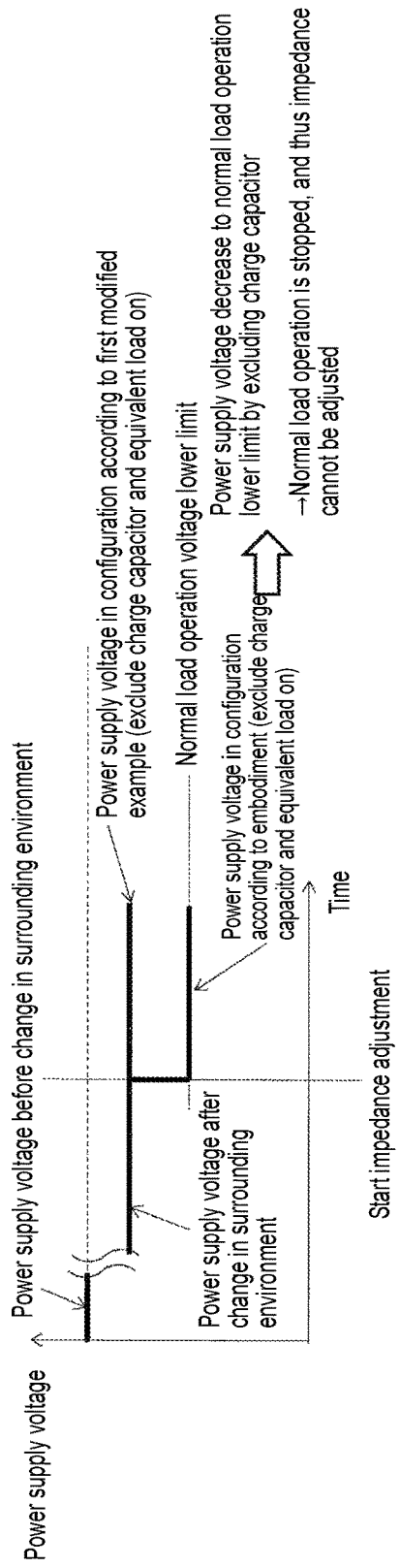
FIG. 12 is a diagram comparing a voltage drop according to an embodiment with a voltage drop according to a first modified example.

According to the embodiment, during the adjustment period in which impedance adjustment is performed, the capacitor 133 is disconnected from the RF tag circuit 10, and the normal load 30 is operated. However, when the normal load 30 is activated at a predetermined cycle, a resistance value of the normal load 30 at the predetermined cycle and a resistance value of the normal load 30 continues to be operated during the adjustment period are different when the duty ratio is considered. For this reason, as exemplified in FIG. 12, the power supply voltage supplied to the normal load 30 may drop to an operation lower limit of the normal load 30 in accordance with a voltage drop at the time of adjusting the impedance. In such a case, the normal load 30 does not operate, and accordingly, it is difficult to adjust the impedance. Thus, in a first modified example, during an adjustment period in which impedance adjustment is performed, an equivalent load is connected to the RF tag circuit instead of the normal load 30. A resistance value of the equivalent load is determined based on the resistance value of the normal load 30 and the duty ratio of the normal load 30. By using the equivalent load, as exemplified in FIG. 12, a drop of the power supply voltage can be configured to be smaller than that of the embodiment. Hereinafter, the first modified example will be described with reference to the drawings. The same reference numeral will be assigned to the same component as that of the embodiment, and description thereof will be omitted.

Figure 13:
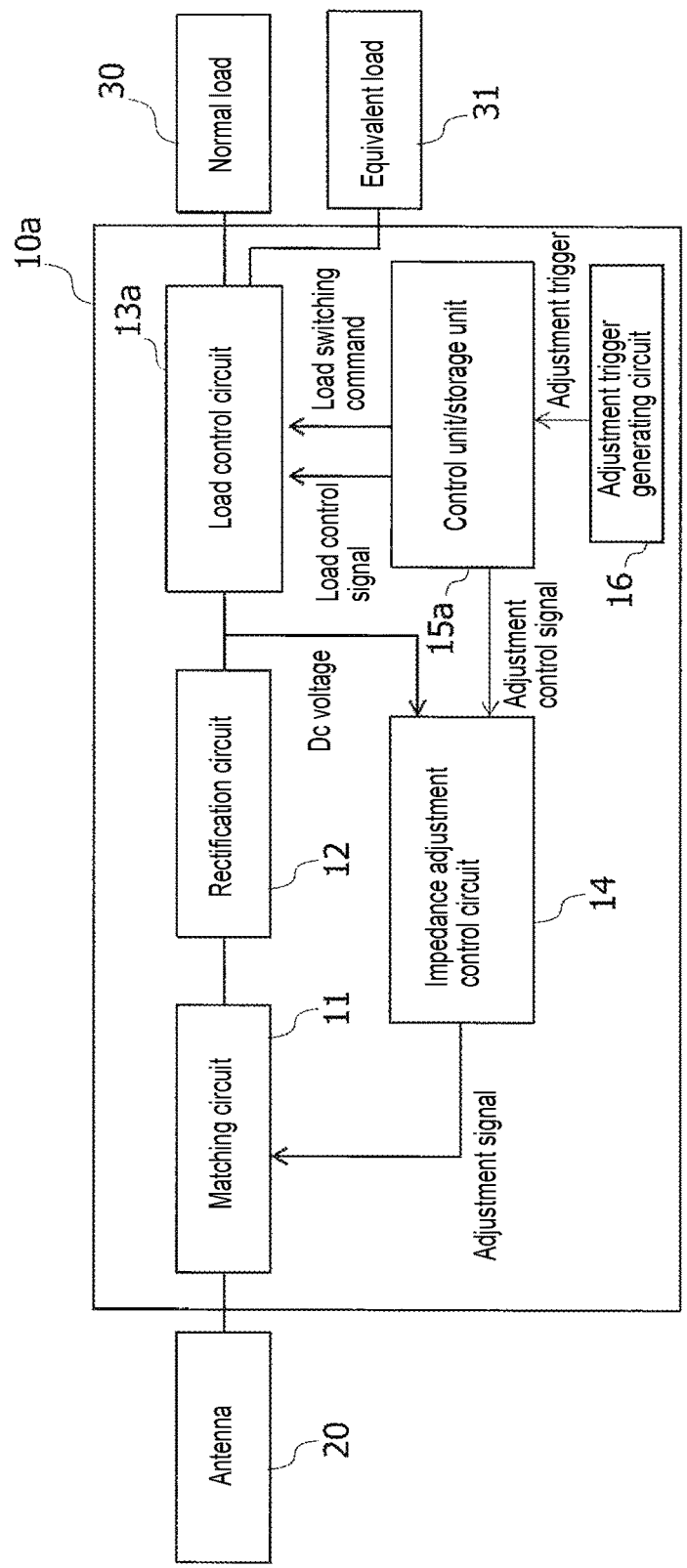
FIG. 13 is a diagram illustrating one example of the configuration of an RF tag circuit according to the first modified example.

FIG. 13 is a diagram illustrating one example of the configuration of an RF tag circuit 10a according to the first modified example. In FIG. 13, the reader/writer device 40 is not illustrated. The RF tag circuit 10a according to the first modified example is different from the RF tag circuit 10 according to the embodiment in that, the control unit/storage unit 15 and the load control circuit 13 are respectively replaced with a control unit/storage unit 15a and a load control circuit 13a, and an equivalent load 31 is further connected.

The control unit/storage unit 15a is different from the control unit/storage unit 15 according to the embodiment in that, the control unit/storage unit 15a transmits a load switching command instructing switching from the normal load 30 to the equivalent load 31 to the load control circuit 13a. The load control circuit 13a is different from the load control circuit 13 according to the embodiment in that, the load control circuit 13a switches from the normal load 30 to the equivalent load 31 in accordance with a load switching command transmitted from the control unit/storage unit 15a.

Figure 14:
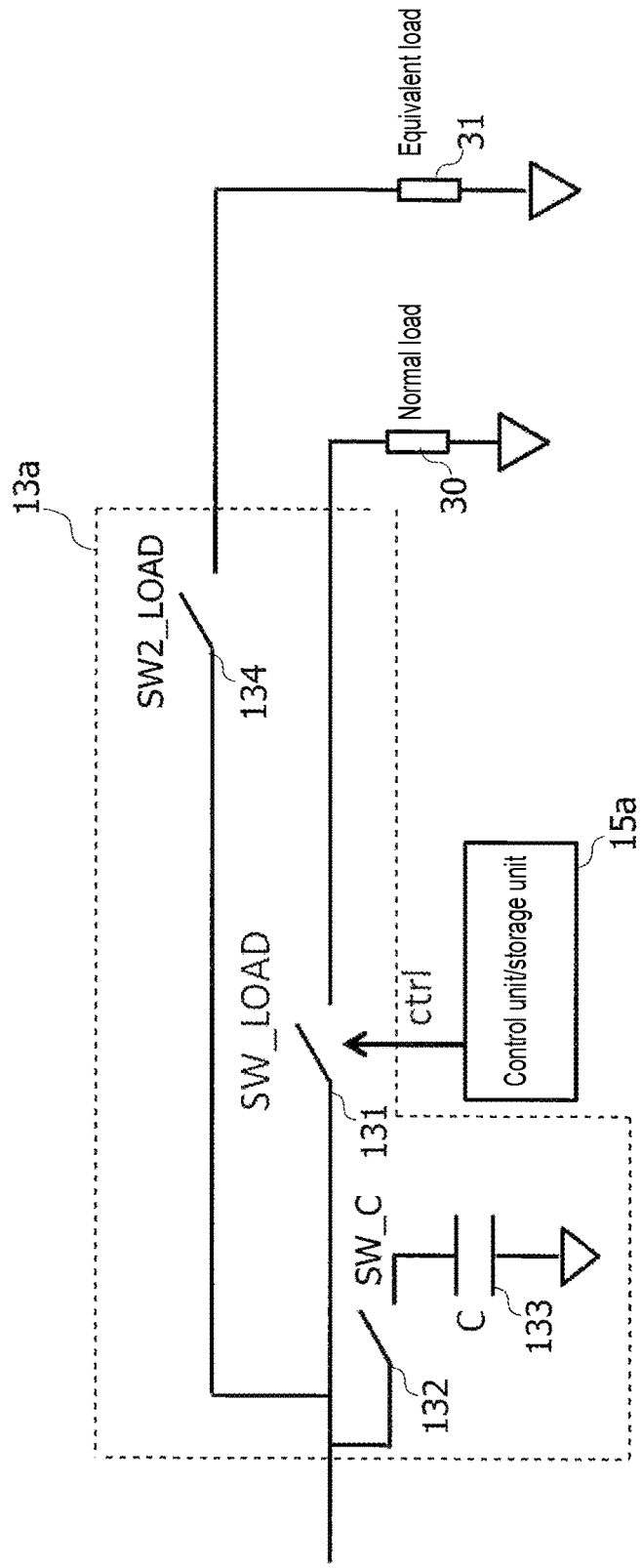
FIG. 14 is a diagram illustrating one example of the configuration of a load control circuit according to the first modified example.

FIG. 14 is a diagram illustrating one example of the configuration of the load control circuit 13a according to the first modified example. The load control circuit 13a is different from the load control circuit 13 according to the embodiment in that, the load control circuit 13a is connected to the equivalent load 31 through an SW2_LOAD 134. When the SW2_LOAD 134 becomes on, the equivalent load 31 is connected to the load control circuit 13a. When the SW2_LOAD 134 becomes off, the equivalent load 31 is disconnected from the load control circuit 13a. The switching between on and off of the SW_LOAD 131, SW_C 132, and SW2_LOAD 134 is executed in accordance with a signal received from the control unit/storage unit 15a. The SW_LOAD 131 is switched between on and off at a predetermined cycle in a period other than an impedance adjustment period and is set off in the impedance adjustment period. The SW_C 132 is on in a period other than the impedance adjustment period and is off in the impedance adjustment period. The SW2_LOAD 134 is off in a period other than the impedance adjustment period and is on in the impedance adjustment period. In other words, in the impedance adjustment period, the capacitor 131 is disconnected from the RF tag circuit 10a, and load connection is switched from the normal load 30 to the equivalent load 31. Here, the arrangement of various switches including the SW_LOAD 131, the SW_C 132, and the SW2_LOAD 134 of the load control circuit 13a is not limited to that of the example illustrated in FIG. 14. For example, the SW_C 132 and the SW_LOAD 131 may be arranged in series.

The equivalent load 31 is a resistance device that has a resistance component of the normal load 30 and a load resistance value corresponding to the predetermined cycle at which the normal load 30 is activated. The equivalent load 31 may be a variable-resistance device that may be set as having the resistance component of the normal load 30 and a load resistance value corresponding to the predetermined cycle at which the normal load 30 is activated. The resistance value of the equivalent load 31, for example, can be determined using the following Equation 2.

$$\text{Equivalent load} = \text{normal load} \div \text{ON/OFF Duty} \qquad \text{(Equation 2)}$$

For example, when the resistance value of the normal load 30 is 1 kΩ, and the duty ratio ("ON/OFF duty" in Equation 2) of the normal load 30 is 10%, the resistance value of the equivalent load 31 is determined as 10 kΩ based on Equation (2). The equivalent load 31 is one example of "substitute load". In addition, in Equation 2, "/ (slash)" included in "ON/OFF duty" does not represent dividing but represents one value as the "ON/OFF duty".

Figure 15:
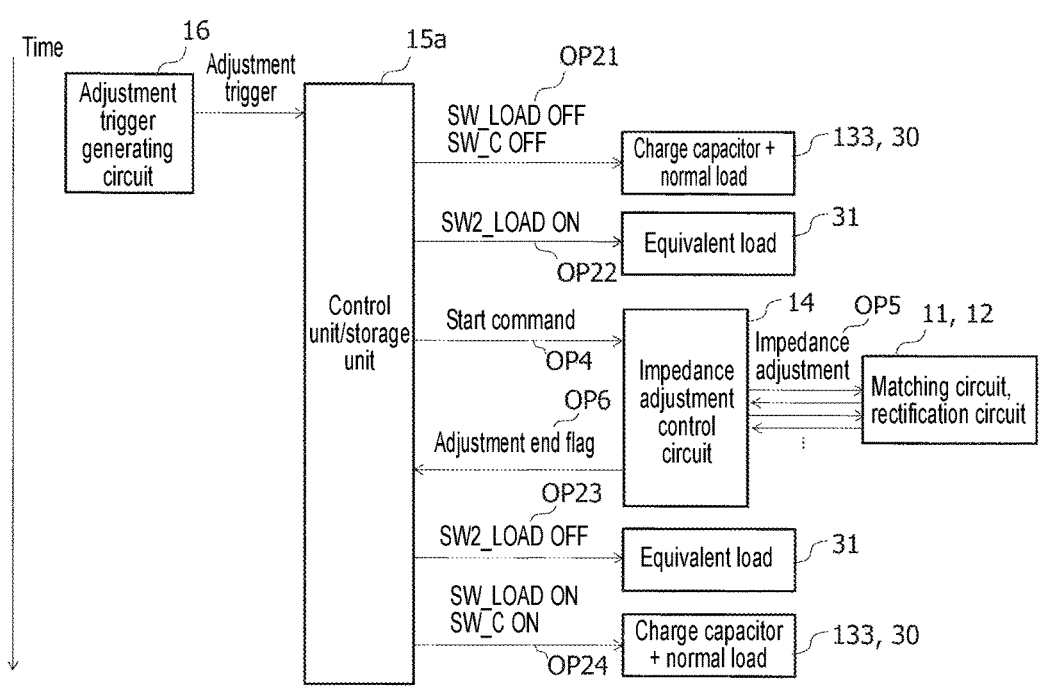
FIG. 15 is a diagram illustrating one example of a processing flow according to the first modified example.

FIG. 15 is a diagram illustrating one example of a processing flow according to the first modified example. In FIG. 15, the same reference sign is assigned to the same component as that illustrated in FIG. 9, and description thereof will be omitted. Hereinafter, one example of the processing flow according to the first modified example will be described with reference to FIG. 15.

In OP21, the control unit/storage unit 15 instructs the load control circuit 13a to turn off the SW_LOAD 131 and the SW_C 132. The load control circuit 13a turns off the SW_LOAD 131 and the SW_C 132 in accordance with the instruction from the control unit/storage unit 15. Thereafter, in OP24, the normal load 30 is not activated regardless of the predetermined cycle until the SW_LOAD 131 is turned on. In accordance with the process of OP21, the normal load 30 and the capacitor 133 are disconnected from the RF tag circuit 10a. In OP22, the control unit/storage unit 15 instructs the load control circuit 13a to turn on the SW2_LOAD 134. The load control circuit 13a turns on the SW2_LOAD 134 in accordance with the instruction from the control unit/storage unit 15. As a result of the process of OP22, the equivalent load 31 is connected to the RF tag circuit 10a. The processes of OP21 and OP22 may be interchanged in the sequence.

In OP23, the control unit/storage unit 15 instructs the load control circuit 13a to turn off the SW2_LOAD 134. The load control circuit 13a turns off the SW2_LOAD 134 in accordance with the instruction from the control unit/storage unit 15. As a result of the process of OP23, the equivalent load 31 is disconnected from the RF tag circuit 10a. In OP24, the control unit/storage unit 15 instructs the load control circuit 13a to turn on the SW_LOAD 131 and the SW_C 132. The load control circuit 13a turns on the SW_LOAD 131 and the SW_C 132 in accordance with the instruction from the control unit/storage unit 15. In accordance with the process of OP24, the normal load 30 and the capacitor 133 are connected to the RF tag circuit 10a. After OP24, the normal load 30 is activated at a predetermined cycle. The processes of OP23 and OP24 may be interchanged in the sequence.

Figure 16:
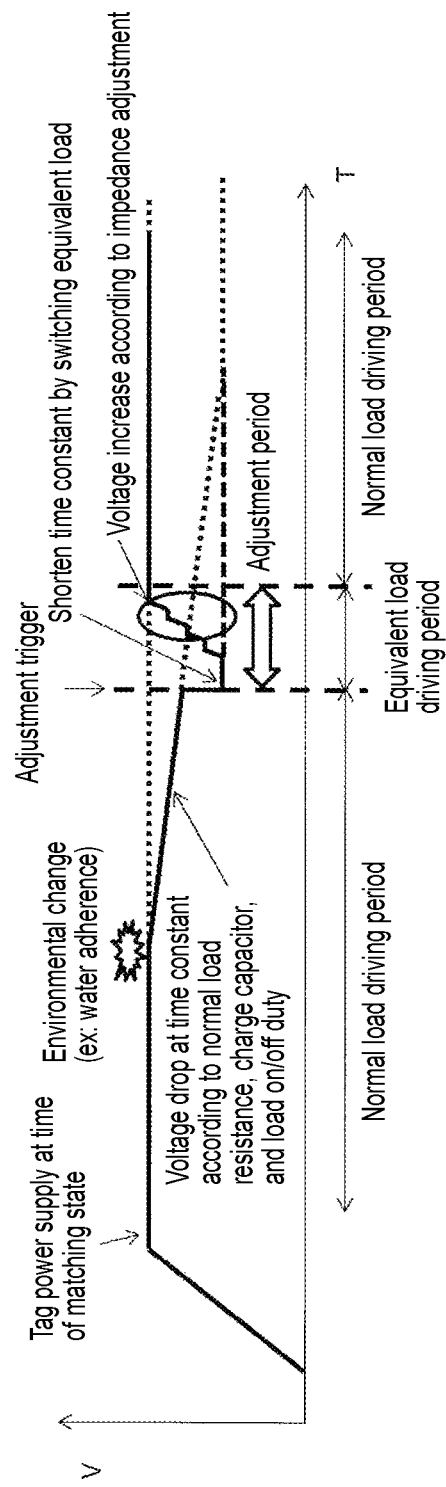
FIG. 16 is a diagram illustrating one example of variations in a power supply voltage input from a rectification circuit to an impedance adjustment control circuit in the first modified example.

FIG. 16 is a diagram illustrating one example of variations in a power supply voltage input from the rectification circuit 12 to the impedance adjustment control circuit 14 in the first modified example. In FIG. 16, similar to FIG. 11, the vertical axis represents the voltage, and the horizontal axis represents the time as an example. In addition, in FIG. 16, similar to FIG. 11, a normal load driving period in which the normal load 30 is activated at a predetermined cycle and an adjustment period in which an impedance is adjusted are exemplified. In the case illustrated in FIG. 16, by being triggered by an input of an adjustment trigger, the normal load 30 is disconnected from the RF tag circuit 10a, and the equivalent load 31 is connected to the RF tag circuit 10a, which is different from FIG. 11. According to the first modified example, the equivalent load 31 is connected instead of the normal load 30 in the impedance adjustment period, and accordingly, a drop in the power supply voltage is smaller than that according to the embodiment.

Second Modified Example

According to the first modified example, the equivalent load 31 of which the resistance value is determined in advance is used. According to a second modified example, an equivalent load of which a resistance value is changeable is employed, and the resistance value of the equivalent load is dynamically determined based on a power supply voltage input from the rectification circuit 12 and a duty ratio of the normal load 30. Hereinafter, the second modified example will be described with reference to the drawings. The same reference sign is assigned to the same component as that of the embodiment or the first modified example, and description thereof will be omitted.

Figure 17:
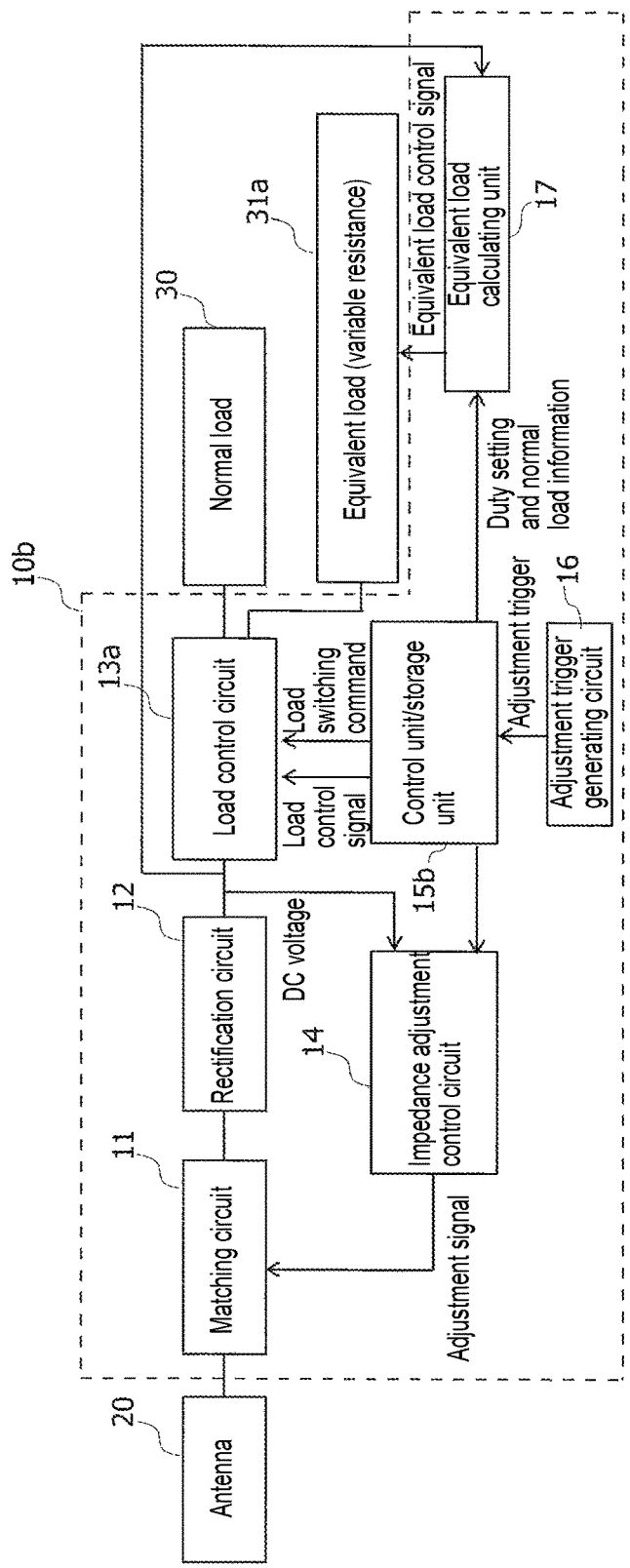
FIG. 17 is a diagram illustrating one example of the configuration of an RF tag circuit according to a second modified example.

FIG. 17 is a diagram illustrating one example of the configuration of an RF tag circuit 10b according to the second modified example. In FIG. 17, the reader/writer device 40 is not illustrated. The RF tag circuit 10b according to the second modified example is different from the first modified example in that, the control unit/storage unit 15a is replaced with a control unit/storage unit 15b, an equivalent load calculating unit 17 is further included, and an equivalent load 31a replacing the equivalent load 31 is connected. The equivalent load 31a has a variable resistance value, and is, for example, an electrical circuit including a constant current circuit configured by a variable resistor, a transistor, or the like.

The control unit/storage unit 15b stores a duty setting and normal load information of the normal load 30 in a storage unit. The duty setting includes information representing a duty ratio of the normal load 30. The normal load information includes at least one of information representing power consumption of the normal load 30 and information representing current consumption of the normal load 30. The control unit/storage unit 15b is different from the control unit/storage unit 15a according to the first modified example in that, the control unit/storage unit 15b transmits the duty setting and the normal load information to the equivalent load calculating unit 17, which. The equivalent load calculating unit 17 calculates a resistance value to be set in the equivalent load 31a based on the duty setting and the normal load information input from the control unit/storage unit 15b and the power supply voltage input from the rectification circuit 12. The resistance value of the equivalent load 31a, for example, can be calculated using the following Equation 3.

$$\begin{aligned}\text{Equivalent load}[\Omega] &= \frac{\text{DC voltage}[V]}{\text{current consumption of normal load}[A] \times \text{Duty setting}[\%]} \\ &= \frac{(\text{DC voltage}[V])^2}{\text{power consumption of normal load}[W] \times \text{Duty setting}[\%]}\end{aligned}$$ (Equation 3)

For example, when it is determined in advance that the DC voltage (power supply voltage) is 2 V, and the current consumption of the normal load 30 is 1 A, the control unit/storage unit 15b stores information representing the power supply voltage and the current consumption of the normal load and provides the stored information for the equivalent load calculating unit 17. The equivalent load calculating unit 17 calculates a resistance value of the equivalent load 31a using Equation 3 based on the information provided from the control unit/storage unit 15b and the power supply voltage input from the rectification circuit 12. The equivalent load calculating unit 17 may set a resistance value of the equivalent load 31a such that the calculated resistance value is obtained.

In addition, when the duty ratio can be changed to four levels of 10%, 25%, 50%, and 100%, the resistance value of the equivalent load 31a may be set to four levels of 20 kΩ, 8 kΩ, 4 kΩ, and 2 kΩ corresponding to the duty ratios in accordance with Equation 3. In such a case, the control unit/storage unit 15b may notify the equivalent load calculating unit 17 of the current duty setting, and the equivalent load calculating unit 17 may set a resistance value corresponding to the notified duty setting in the equivalent load 31a. Alternatively, as the equivalent load 31a, four kinds of loads including a load of 20 kΩ, a load of 8 kΩ, a load of 4 kΩ, and a load of 2 kΩ are prepared, and the resistance value of the equivalent load 31a may be set by connecting a load corresponding to the duty ratio to the RF tag circuit 10b.

According to the second modified example, the equivalent load calculating unit 17 calculates a resistance value to be set in the equivalent load 31a based on the normal load information and the duty setting input from the control unit/storage unit 15b and the power supply voltage input from the rectification circuit 12. The calculated resistance value is set as the resistance value of the equivalent load 31a. For this reason, according to the second modified example, a resistance value of the equivalent load 31a can be appropriately set even when there are variations in the normal load information, the duty setting, and the power supply voltage.

Third Modified Example

According to the second modified example, the normal load information is stored in the control unit/storage unit 15b. According to a third modified example, a current flowing through the normal load 30 is measured, and an equivalent load calculating unit calculates a resistance value of the equivalent load by referring to a result of the measurement of the current. Hereinafter, the third modified example will be described with reference to the drawings. The same reference sign is assigned to the same component as that of the embodiment, the first modified example, or the second modified example, and description thereof will be omitted.

Figure 18:
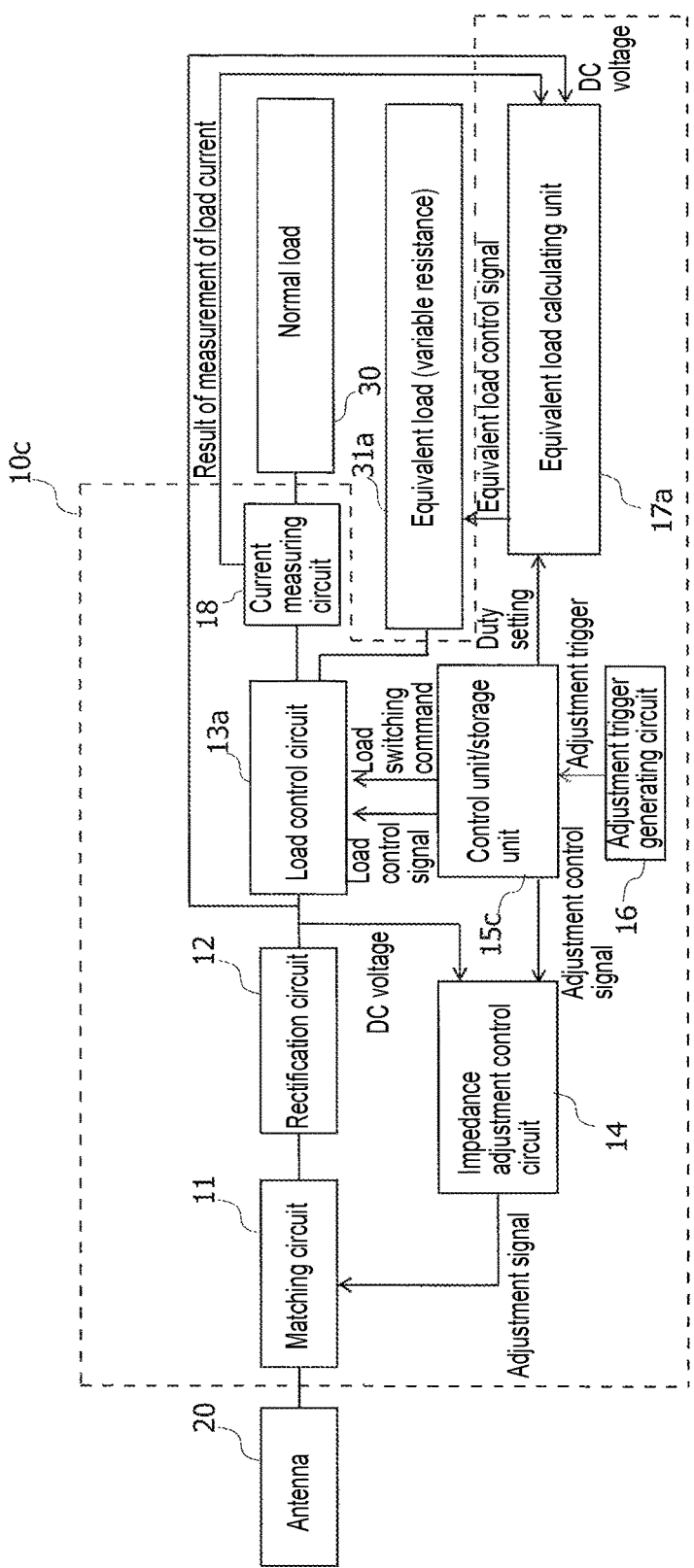
FIG. 18 is a diagram illustrating one example of the configuration of an RF tag circuit according to a third modified example.

FIG. 18 is a diagram illustrating one example of the configuration of an RF tag circuit 10c according to the third modified example. In FIG. 18, the reader/writer device 40 is not illustrated. The RF tag circuit 10c according to the third modified example is different from the RF tag circuit 10b according to the second modified example in that, the control unit/storage unit 15b and the equivalent load calculating unit 17 are respectively replaced with a control unit/storage unit 15c and an equivalent load calculating unit 17a.

The control unit/storage unit 15c is different from the control unit/storage unit 15b according to the second modified example in that the control unit/storage unit 15c transmits the duty setting to the equivalent load calculating unit 17a but does not transmit the normal load information. The equivalent load calculating unit 17a is different from the equivalent load calculating unit 17 according to the second modified example in that, the equivalent load calculating unit 17a calculates a resistance value of the equivalent load 31a based on the duty setting input from the control unit/storage unit 15c and the result of the measurement of the current input from the current measuring circuit 18.

Figure 19:
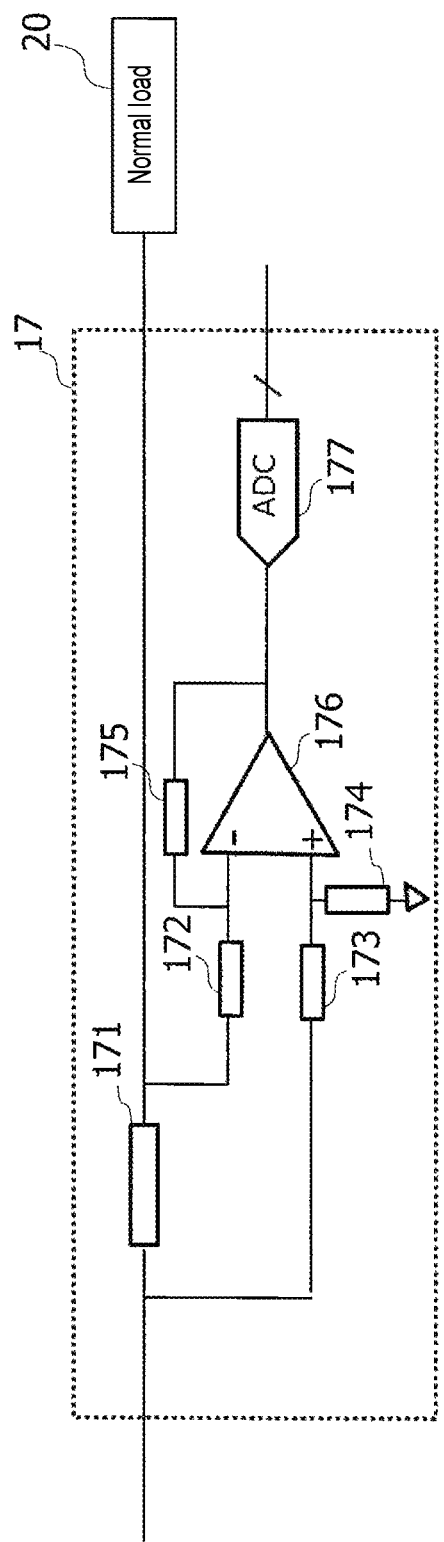
FIG. 19 is a diagram illustrating one example of the configuration of a current measuring circuit.

The current measuring circuit 18 is a circuit that measures a current flowing through the normal load 30. A specific circuit configuration of the current measuring circuit 18 is not particularly limited. FIG. 19 is a diagram illustrating one example of the configuration of the current measuring circuit 18. The current measuring circuit 18, for example, as exemplified in FIG. 19, may be a circuit acquired by combining an analog-to-digital converter (ADC) 177, a comparator 176, and a plurality of resistors 171, 172, 173, 174, and 175. The current measuring circuit 18 is one example of "measurement unit".

The equivalent load calculating unit 17, for example, can calculate a resistance value of the equivalent load 31a using the following Equation 4.

$$\text{Equivalent load}[\Omega] = \frac{\text{DC voltage}[V]}{\text{load current}[A] \times \text{Duty setting}[\%]} \quad \text{(Equation 4)}$$

According to the third modified example, a current flowing through the normal load 30 is measured by the current measuring circuit 18. For this reason, according to the third modified example, even when the current flowing through the normal load 30 changes, the resistance value of the equivalent load 31a can be appropriately set.

Fourth Modified Example

From the embodiments to the third modified example, the normal load 30 is activated at a predetermined cycle. In other words, from the embodiments to the third modified examples, the duty ratio of the normal load 30 is assumed to be known. In a fourth modified example, a case will be considered in which the duty ratio of the normal load 30 varies. According to the fourth modified example, for example, the normal load 30 is activated in accordance with an instruction from the reader/writer device 40. For this reason, in the fourth modified example, the duty setting is not stored in the RF tag circuit, and the duty ratio of the normal load 30 may vary due to a communication error between the reader/writer device 40 and the RF tag circuit or the like. In the fourth modified example, a configuration capable of appropriately setting the resistance value of the equivalent load even when the duty ratio varies will be described. Hereinafter, the fourth modified example will be described with reference to the drawings. The same reference sign is assigned to the same component as that of the embodiments or one of the first to third modified examples, and description thereof will be omitted.

Figure 20:
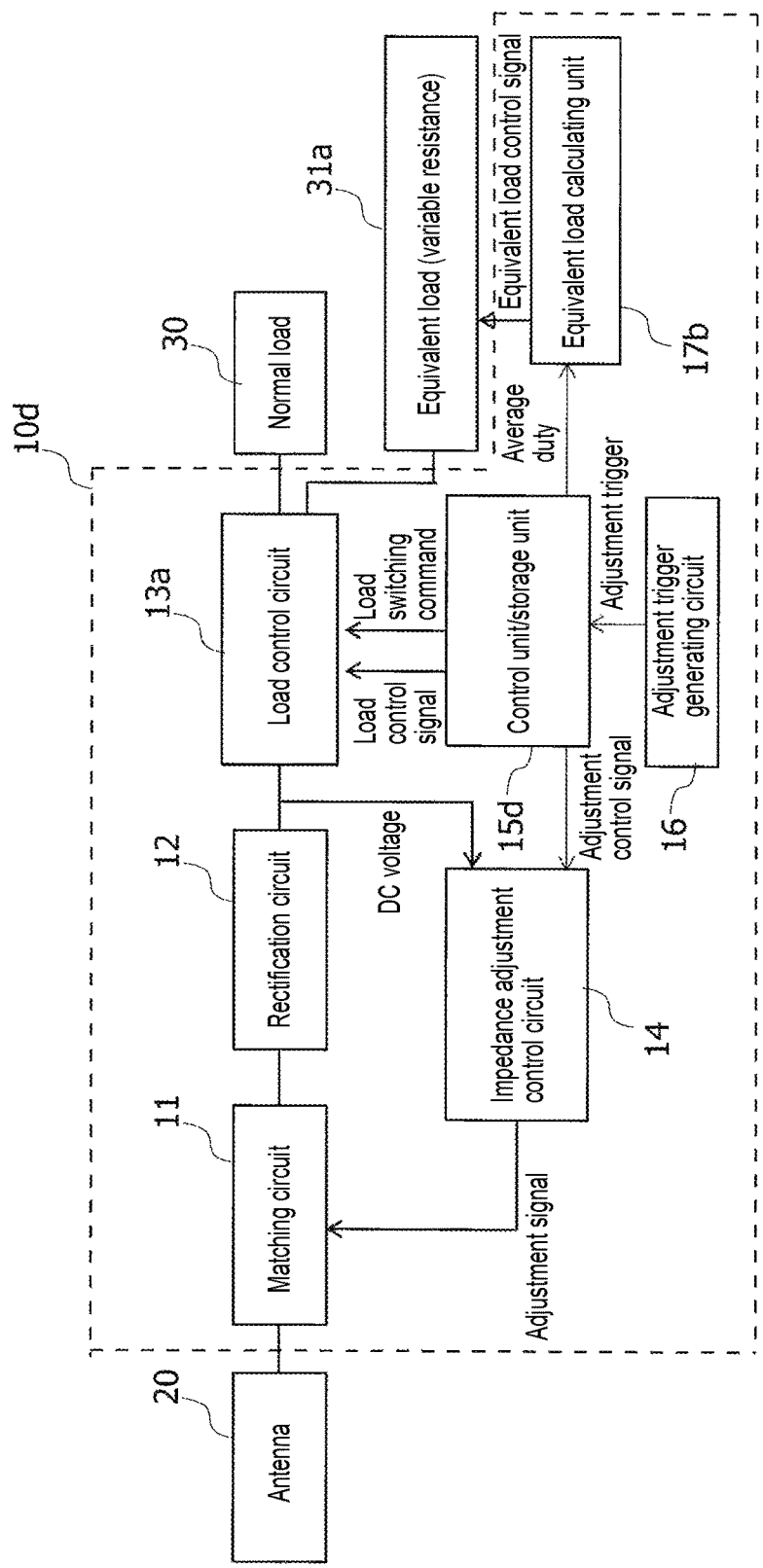
FIG. 20 is a diagram illustrating one example of the configuration of an RF tag circuit according to a fourth modified example.

FIG. 20 is a diagram illustrating one example of the configuration of an RF tag circuit 10d according to the fourth modified example. In FIG. 20, the reader/writer device 40 is not illustrated. The RF tag circuit 10d according to the fourth modified example is different from the third modified example in that, the control unit/storage unit 15c and the equivalent load calculating unit 17a are respectively replaced with a control unit/storage unit 15d and an equivalent load calculating unit 17b.

The control unit/storage unit 15d measures and aggregates the period during which the normal load 30 is on and the period during which the normal load 30 is off and calculates an average of the duty ratios of the normal load 30 based on a result of the aggregation. The control unit/storage unit 15d transmits an average value (average duty) of the calculated duty ratios to the equivalent load calculating unit 17b. The equivalent load calculating unit 17b calculates a resistance value of the equivalent load 31a using the average value of the duty ratios received from the control unit/storage unit 15d. For the calculation of the resistance value, for example, the received average value of the duty ratios may be substituted in Equation 2, Equation 3, or Equation 4.

According to the fourth modified example, the control unit/storage unit 15d measures the period during which the normal load 30 is on and the period during which the normal load 30 is off and calculates an average of duty ratios of the normal load 30 based on a result of the measurement. For this reason, even when information relating to a duty ratio is not included in the RF tag circuit 10d, a duty ratio of the normal load 30 can be calculated. In addition, since the control unit/storage unit 15d calculates a duty ratio of the normal load 30, for example, even when the duty ratio of the normal load 30 varies due to a communication error or the like when the normal load 30 is activated in accordance with an instruction from the reader/writer device 40, a duty ratio on which the influence of such a variation is reflected can be calculated. For this reason, according to the fourth modified example, even when the duty ratio varies, a resistance value of the equivalent load 31a can be appropriately set.

Fifth Modified Example

Figure 21:
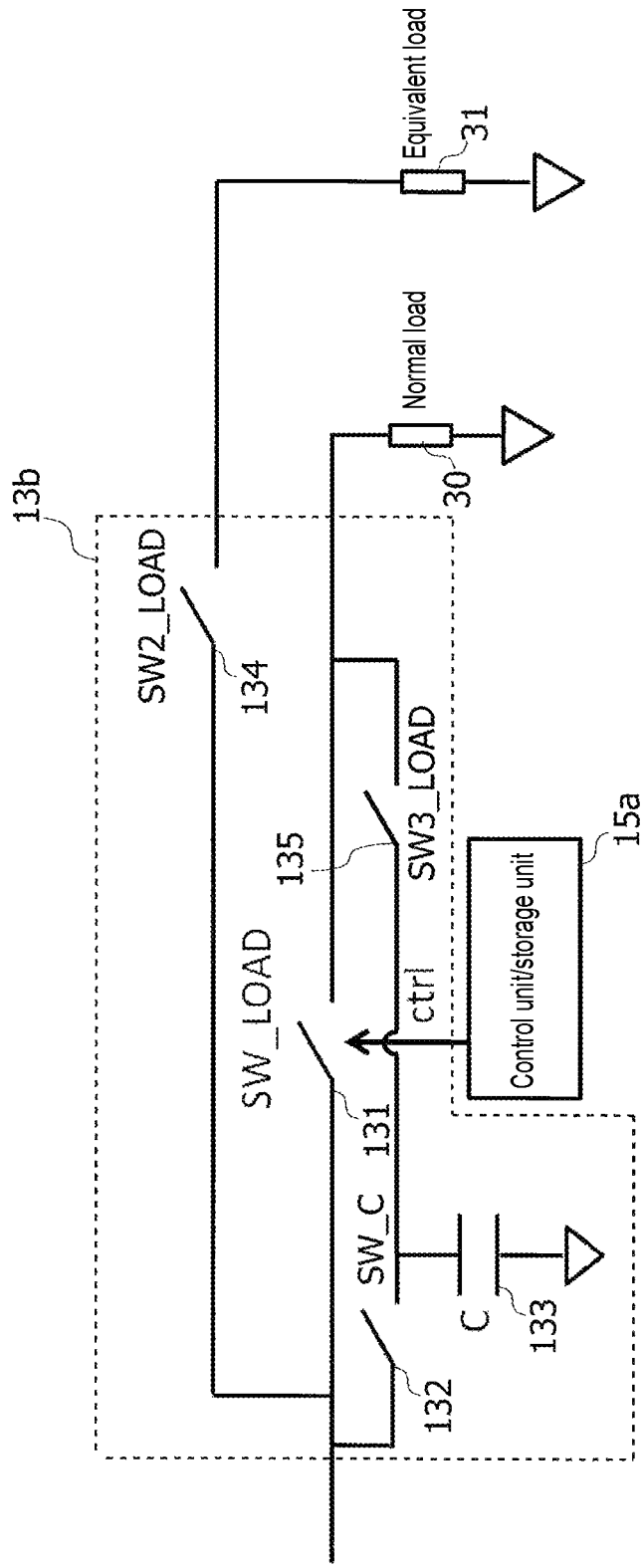
FIG. 21 is a diagram illustrating one example of the configuration of a load control circuit according to a fifth modified example.

FIG. 21 is a diagram illustrating one example of the configuration of a load control circuit 13b according to a fifth modified example. In the first to fourth modified examples, the capacitor 133 is disconnected from the load control circuit when the impedance is adjusted. In the fifth modified example, when the impedance is adjusted, the capacitor 133 is disconnected from the load control circuit, and the capacitor 133 and the normal load 30 are connected. Hereinafter, the fifth modified example will be described with reference to the drawings.

According to the fifth modified example, for example, in the configuration according to the first modified example exemplified in FIG. 14, a wiring connecting the normal load 30 and the capacitor 133 is added separately from a wiring passing through the SW_LOAD 131. In the added wiring, an SW3_LOAD 135 is disposed. The SW3_LOAD 135 is turned off except during the impedance adjustment. According to the fifth modified example, when the equivalent load 31 is connected to the load control circuit 13b by turning off the SW_LOAD 131 and the SW_C 132 and turning on the SW2_LOAD 134, the control unit/storage unit 15 connects the capacitor 133 and the normal load 30 by turning on the SW3_LOAD 135. According to the fifth modified example, electric power is supplied from the capacitor 133 to the normal load 30 also during the impedance adjustment. Therefore, even during the impedance adjustment, the normal load 30 can be continuously operated.

In the embodiments and the modified examples described above, the impedance adjustment is performed using a linear search of monotonously increasing the capacitance of the variable-capacitance capacitor 53 disposed inside the matching circuit 11. However, the algorithm of the impedance adjustment is not limited to the linear search of monotonously increasing the capacitance of the variable-capacitance capacitor 53. For example, the impedance adjustment may be performed using a linear search of monotonously decreasing the capacitance of the variable-capacitance capacitor 53. In addition, the impedance adjustment may be performed using an arbitrary search algorithm such as a binary search or a tree search.

The embodiment and the modified examples described above may be combined together.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An RF tag circuit connected to an antenna and a load, the RF tag circuit comprising:
   a rectification circuit that rectifies a radio wave received by the antenna and supplies DC power;
   a matching circuit, of which an impedance is changeable, disposed between the antenna and the rectification circuit;
   a power storage unit that stores the DC power input from the rectification circuit and supplies the stored DC power to the load; and
   a control unit that disconnects the power storage unit from the RF tag circuit and adjusts the impedance of the matching circuit such that the DC power supplied by the rectification circuit increases.

2. The RF tag circuit according to claim 1, wherein when adjusting the impedance of the matching circuit, the control unit further executes a process of disconnecting the load from the RF tag circuit and connecting a substitute load having a resistance value different from the load to the RF tag circuit.

3. The RF tag circuit according to claim 2, wherein the substitute load has a power consumption lower than the load or has a resistance value larger than the load.

4. The RF tag circuit according to claim 3,
   wherein the load is driven at a predetermined cycle, and
   wherein the substitute load has a resistance value determined based on a duty ratio representing a ratio of a driving period of the load in the predetermined cycle and the resistance value of the load.

5. The RF tag circuit according to claim 4,
   wherein the substitute load is a variable resistor of which a resistance value is changeable, and
   wherein the control unit calculates a resistance value based on a current consumption of the load, the duty ratio of the load, and a voltage applied to the load, and sets the calculated resistance value as the resistance value of the substitute load.

6. The RF tag circuit according to claim 5, further comprising:
   a measurement unit that measures a current supplied to the load,
   wherein the current consumption of the load is measured by the measurement unit.

7. The RF tag circuit according to claim 5, wherein the control unit calculates the duty ratio of the load by aggregating a period during which the load is driven and a period during which the load is not driven.

8. The RF tag circuit according to claim 4, wherein the control unit calculates the duty ratio of the load by aggregating a period during which the load is driven and a period during which the load is not driven.

9. The RF tag circuit according to claim 3, wherein the control unit further executes a process of connecting the power storage unit and the load when executing the process of connecting the substitute load to the RF tag circuit.

10. The RF tag circuit according to claim 2,
    wherein the load is driven at a predetermined cycle, and
    wherein the substitute load has a resistance value determined based on a duty ratio representing a ratio of a driving period of the load in the predetermined cycle and the resistance value of the load.

11. The RF tag circuit according to claim 10,
    wherein the substitute load is a variable resistor of which a resistance value is changeable, and
    wherein the control unit calculates a resistance value based on a current consumption of the load, the duty ratio of the load, and a voltage applied to the load, and sets the calculated resistance value as the resistance value of the substitute load.

12. The RF tag circuit according to claim 11, further comprising:
a measurement unit that measures a current supplied to the load,
wherein the current consumption of the load is measured by the measurement unit.

13. The RF tag circuit according to claim 12, wherein the control unit calculates the duty ratio of the load by aggregating a period during which the load is driven and a period during which the load is not driven.

14. The RF tag circuit according to claim 12, wherein the control unit further executes a process of connecting the power storage unit and the load when executing the process of connecting the substitute load to the RF tag circuit.

15. The RF tag circuit according to claim 11, wherein the control unit calculates the duty ratio of the load by aggregating a period during which the load is driven and a period during which the load is not driven.

16. The RF tag circuit according to claim 11, wherein the control unit further executes a process of connecting the power storage unit and the load when executing the process of connecting the substitute load to the RF tag circuit.

17. The RF tag circuit according to claim 10, wherein the control unit calculates the duty ratio of the load by aggregating a period during which the load is driven and a period during which the load is not driven.

18. The RF tag circuit according to claim 17, wherein the control unit further executes a process of connecting the power storage unit and the load when executing the process of connecting the substitute load to the RF tag circuit.

19. The RF tag circuit according to claim 10, wherein the control unit further executes a process of connecting the power storage unit and the load when executing the process of connecting the substitute load to the RF tag circuit.

20. The RF tag circuit according to claim 2, wherein the control unit further executes a process of connecting the power storage unit and the load when executing the process of connecting the substitute load to the RF tag circuit.

* * * * *